(12) United States Patent
Lu et al.

(10) Patent No.: US 8,047,857 B1
(45) Date of Patent: Nov. 1, 2011

(54) BATTERY CONNECTOR

(75) Inventors: Jian-Jin Lu, Guang-Dong (CN);
Yin-Lung Wu, Tu-Cheng (TW);
Bing-Tao Yang, Guang-Dong (CN);
Ming-Chiang Chen, Tu-Cheng (TW)

(73) Assignee: Cheng Uei Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/912,643

(22) Filed: Oct. 26, 2010

(51) Int. Cl.
*H01R 12/00* (2006.01)
*H05K 1/00* (2006.01)
(52) U.S. Cl. ............................ 439/83; 439/500; 439/862
(58) Field of Classification Search .................... 439/79, 439/83, 500, 862, 504, 733.1, 660
See application file for complete search history.

(56) References Cited

U.S. PATENT DOCUMENTS 6,695,628 B2 * 2/2004 Yeh .................................. 439/83

* cited by examiner

*Primary Examiner* — Javaid Nasri
(74) *Attorney, Agent, or Firm* — Cheng-Ju Chaing

(57) ABSTRACT

A battery connector mounted on a printed circuit board which has an insulating housing having a top surface, a bottom surface, a front surface, a rear surface and two side surfaces. The front surface defines a plurality of terminal grooves. The rear surface defines two first fixing grooves and two second fixing grooves. A plurality of conductive terminals fixed in the terminal grooves each has a soldering portion for soldering on the printed circuit board. A pair of fixing elements each has a first fixing slice secured in the first fixing groove. The first fixing slice is bent perpendicularly to form a soldering slice for soldering with the printed circuit board. A connecting portion extends perpendicularly from the first fixing slice for being attached on the rear surface. A distal end of the connecting portion is bent frontward to form a second fixing slice fixed in the second fixing groove.

9 Claims, 8 Drawing Sheets

BATTERY CONNECTOR

BACKGROUND OF THE INVENTION

1. Field of the Invention

The present invention relates to a battery connector, and particularly to a battery connector fixedly mounted on a printed circuit board.

2. The Related Art

A battery working as a power supply is often assembled in the portable electronic products to provide electricity for the portable electronic products, such as mobile phone, portable computer, digital camera and so on. Correspondingly, in order to meet the requirement of transmitting electricity from the battery to the portable electronic products, the portable electronic products usually has a printed circuit board mounted therein and a battery connector fixed on the printed circuit board.

Refer to FIG. 1, a conventional battery connector comprises an insulating housing 41 and at least one conductive terminal 42 fixed in the insulating housing 41. The conductive terminal 42 further comprises a contacting portion 43 extending beyond the insulating housing 41 from a side of the insulating housing 41 for contacting with an outer battery 45, and a soldering portion 47 exposed out of the insulating housing 41 for soldering with a printed circuit board 44. However, the battery connector is mounted on the printed circuit board 44 only by means of soldering the soldering portions 47 with the printed circuit board 44, so the battery connector is apt to break off from the printed circuit board 44 when the outer battery 45 is mated with the battery connector. As a result, an electrical connection between the battery connector and the printed circuit board 44 would interrupt. Therefore, a battery connector capable of overcoming the foregoing problem is required.

SUMMARY OF THE INVENTION

Accordingly, an object of the present invention is to provide a battery connector mounted on a printed circuit board. The battery connector includes an insulating housing which has a top surface, a bottom surface, a front surface, a rear surface and two side surfaces. The front surface defines a plurality of terminal grooves extending along a vertical direction. Two opposite sides of the rear surface respectively define a first fixing groove extending vertically adjacent to the corresponding side surface and penetrating the bottom surface of the insulating housing, and a second fixing groove spaced away from the first fixing groove. A plurality of conductive terminals is fixed in the terminal grooves respectively. Each of the conductive terminals has a soldering portion exposed from the bottom surface of the insulating housing for being soldered on the printed circuit board. A pair of fixing elements each has a first fixing slice secured in the first fixing groove. A bottom edge of the first fixing slice is bent perpendicularly to form a soldering slice exposed outside the bottom surface for being soldered with the printed circuit board. A connecting portion is extended perpendicularly from a rear edge of the first fixing slice for being attached on the rear surface of the insulating housing. A distal end of the connecting portion is bent frontward to form a second fixing slice fixed in the second fixing groove.

As described above, the battery connector further has two fixing elements which respectively have the soldering slice soldered on the printed circuit board. So such structure can effectively avoid the battery connector breaking off from the printed circuit board and further strength the connection between the battery connector and the printed circuit board even when the outer battery excessively abuts against the battery connector. As a result, the electrical connection between the battery connector and the printed circuit board is more stable than the case shown as the prior art. Furthermore, as the second fixing slice of the fixing element is secured in the second fixing groove of the insulating housing and the connecting portion attaches on the rear surface of the insulating housing, so such structure can improve the strengthen of the battery connector.

BRIEF DESCRIPTION OF THE DRAWINGS

The present invention will be apparent to those skilled in the art by reading the following description thereof, with reference to the attached drawings, in which.

DETAILED DESCRIPTION OF THE EMBODIMENT

Figure 1:
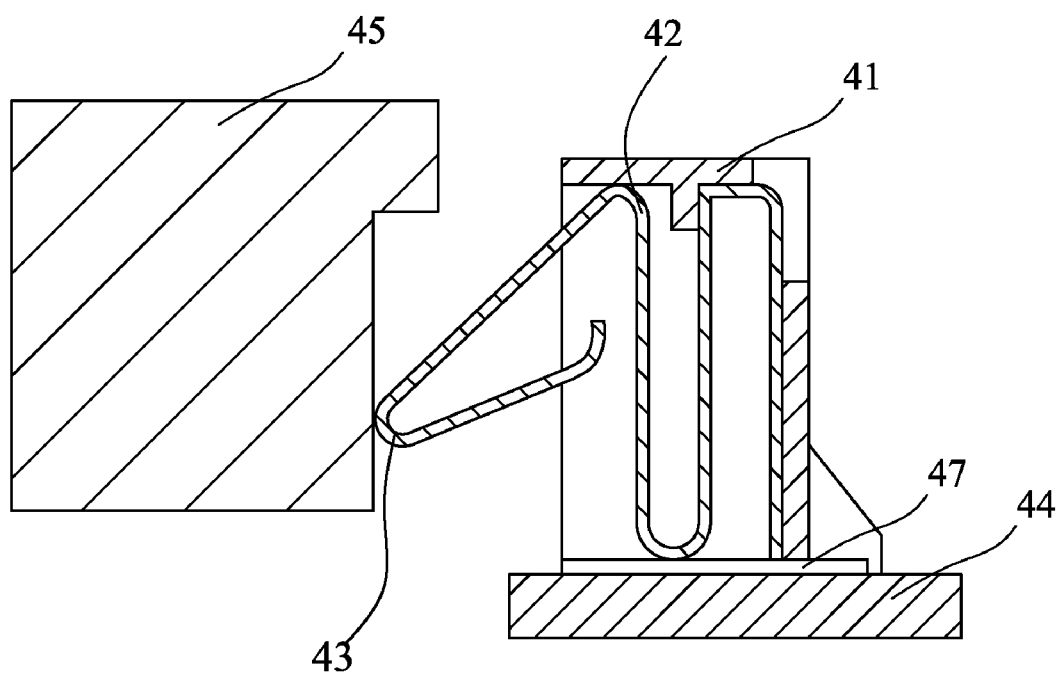
FIG. 1 is a cross-sectional view showing a relationship between an outer battery and a battery connector mounted on a printed circuit board in accordance with a prior art.
Figure 2:
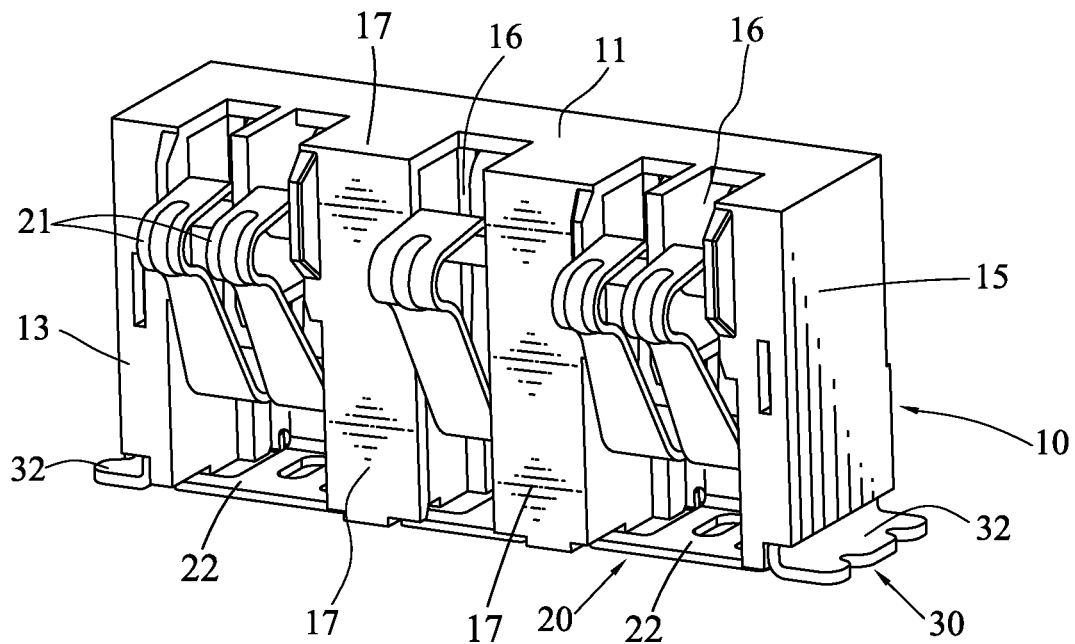
FIG. 2 is an assembled, perspective view of a battery connector in accordance with the present invention.
Figure 4:
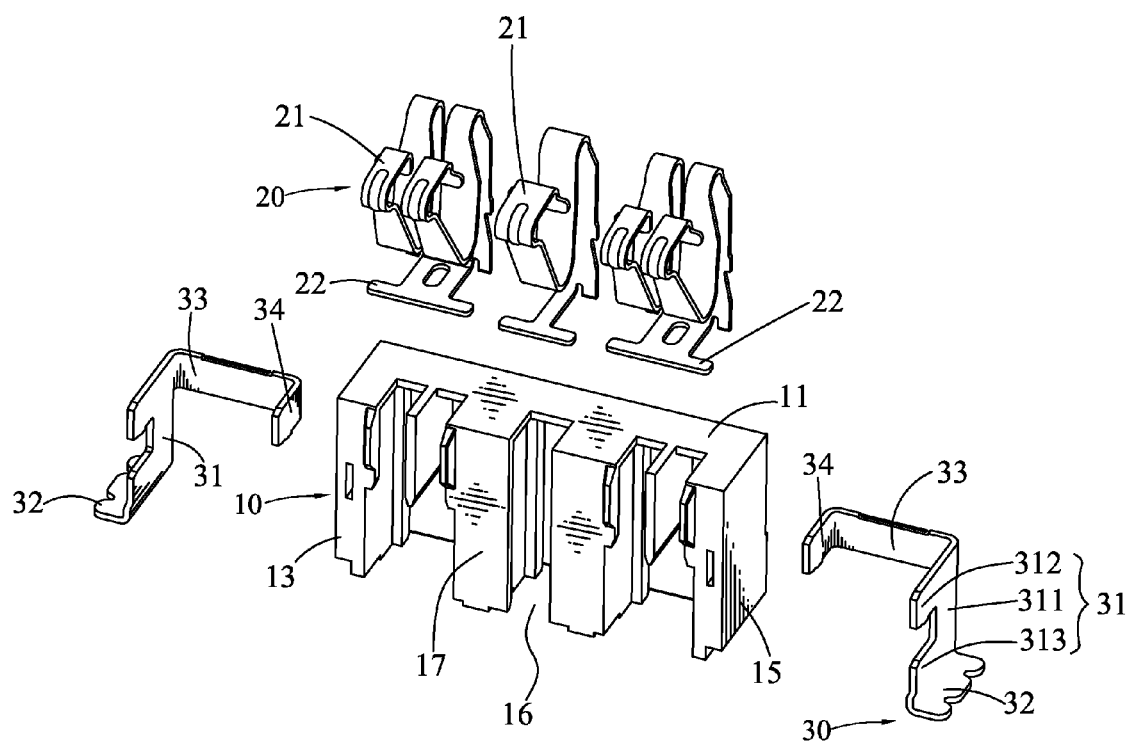
FIG. 4 is an exploded, perspective view of the battery connector shown FIG. 2.
Figure 5:
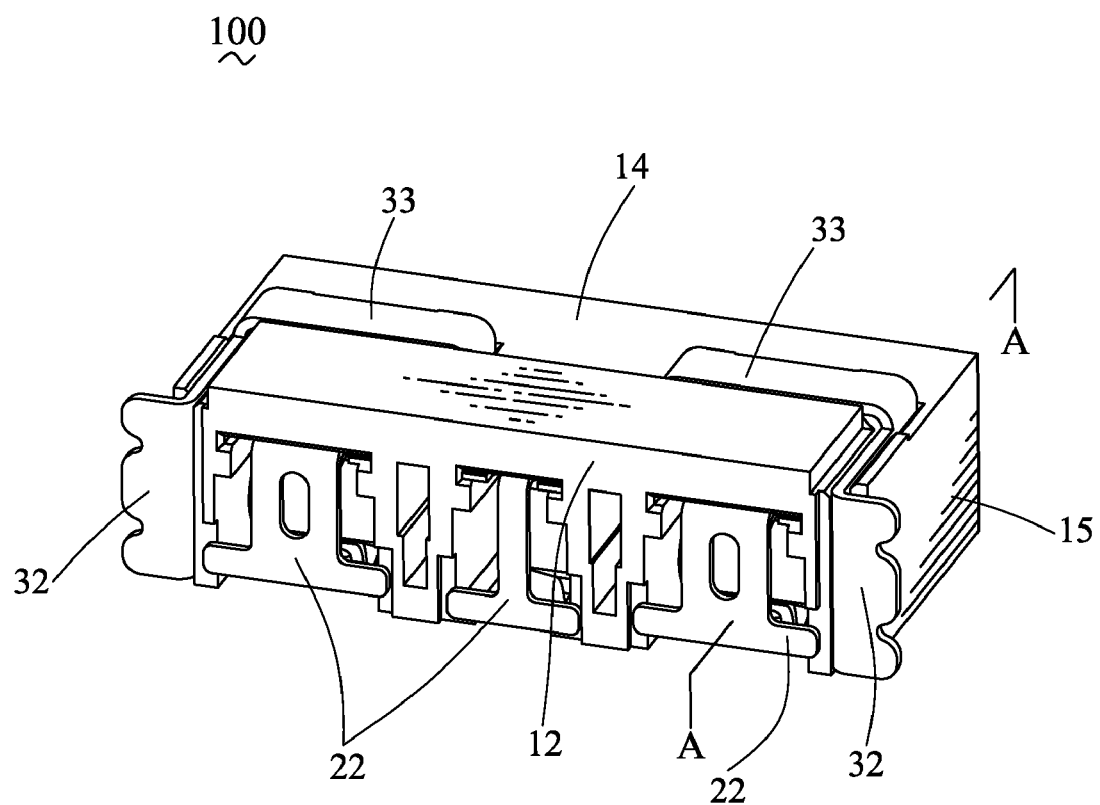
FIG. 5 is an assembled, perspective view of the battery connector of FIG. 2 viewed from another angle.

Referring to the drawings in greater detail, and first to FIG. 2 and FIG. 4, the embodiment of the invention is embodied in a battery connector 100. The battery connector 100 includes an insulating housing 10, a plurality of conductive terminals 20 and a pair of fixing elements 30.

Referring to FIGS. 2-4 and FIG. 7, the insulating housing 10 is of substantially rectangular and has a top surface 11, a bottom surface 12, a front surface 13, a rear surface 14 and two opposite side surfaces 15. The front surface 13 defines a plurality of terminal grooves 16 extending along a vertical direction and passing through the top surface 11 and the bottom surface 12 for receiving the conductive terminals 20 therein. A plurality of separating walls 17 each is accordingly formed between two adjacent terminal grooves 16 of the insulating housing 10. In this embodiment, there are three terminals grooves 16 formed on the front surface 13 and two separating walls 17 located in a middle portion of the insulating housing 10. Two opposite sides of the rear surface 14 respectively define a first fixing groove 142 extending vertically adjacent to the corresponding side surface 15 and penetrating the bottom surface 12 of the insulating housing 10. The first fixing groove 142 includes a main groove 1421 defined in the rear surface 14, a first inserting groove 1422 recessed toward the front surface 13 from an upper end of the bottom of the main groove 142, and a second inserting groove 1423 recessed toward the front surface 13 from a lower end of the bottom of the main groove 1421. The second inserting groove 1423 penetrates the bottom surface 12 of the insulating housing 10. The insulating housing 10 has two second fixing grooves 141 spaced away from the corresponding first fixing grooves 142 and corresponding to the two separating walls 17. The second fixing groove 141 is substantially in alignment with an upper end of the main groove 1421.

Figure 3:
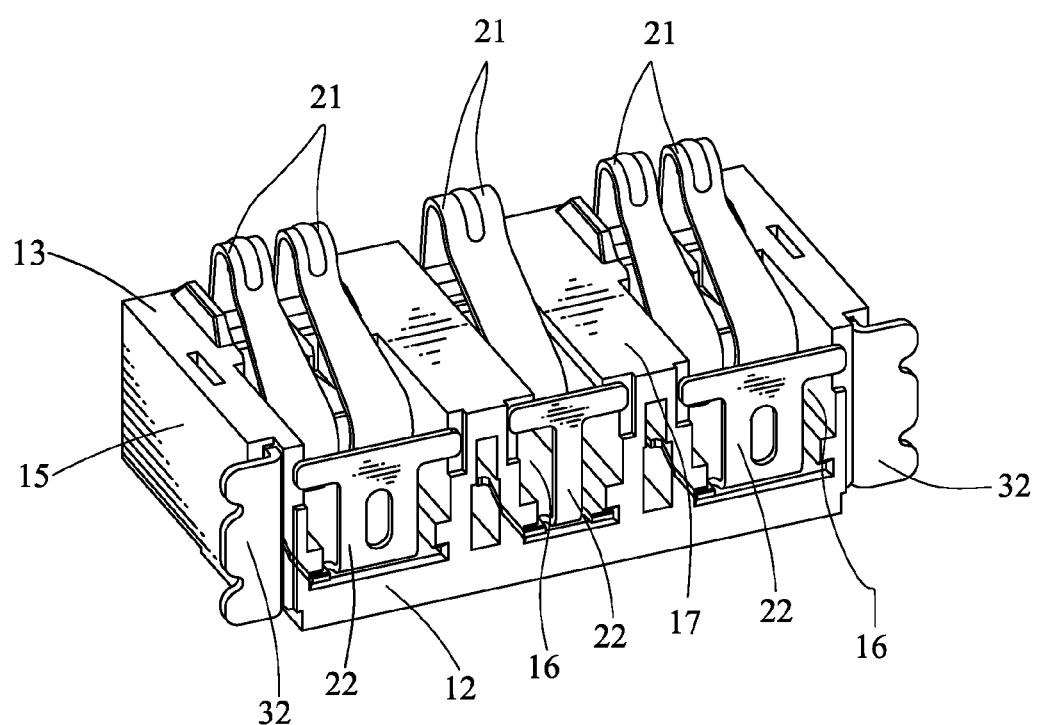
FIG. 3 is an assembled, perspective view of the battery connector of FIG. 2 viewed from another angle.
Figure 6:
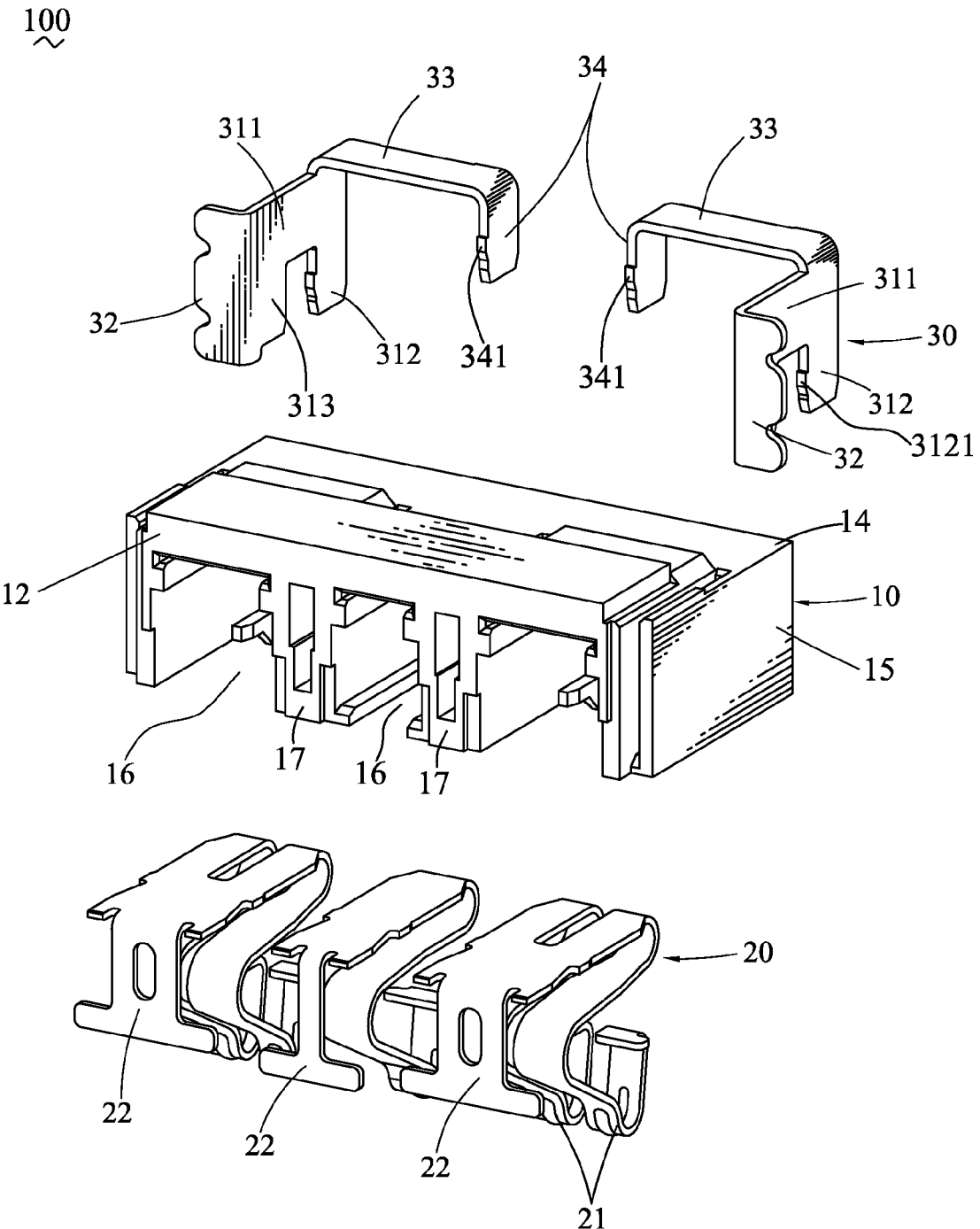
FIG. 6 is an exploded, perspective view of the battery connector of FIG. 5.
Figure 7:
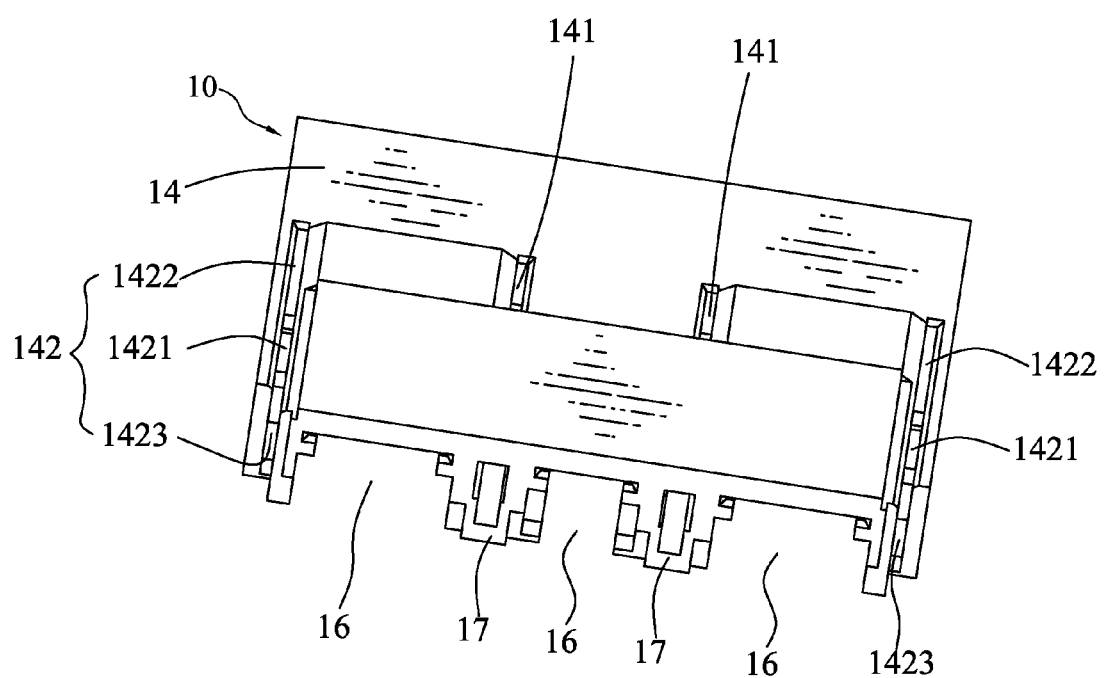
FIG. 7 is a perspective view of an insulating housing of the battery connector of FIG. 2 viewed from another angle.
Figure 8:
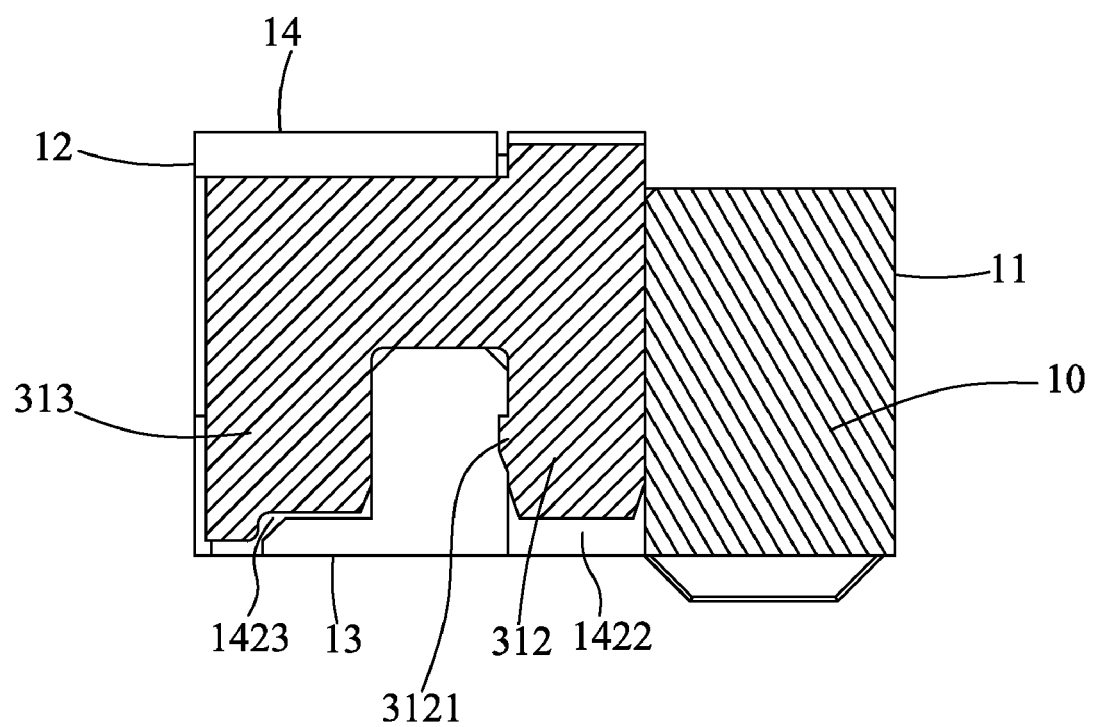
FIG. 8 is a cross-sectional view of the battery connector taken along line A-A of FIG. 5.

Referring to FIG. 3, FIG. 4 and FIG. 6, the conductive terminal 20 has at least one contacting portion 21 and a soldering portion 22 stretching out of the bottom surface 12 of the insulating housing 10 when the conductive terminal 20 is fastened in the terminal groove 16.

With reference to FIGS. 4-8, the fixing element 30 has a first fixing slice 31 secured in the first fixing groove 142. The first fixing slice 31 includes a base portion 311 for being secured in the main groove 1421 of the insulating housing 10, a first inserting portion 312 extended frontward from an upper end of a front edge of the base portion 311, and a second inserting portion 313 extended frontward from a lower end of a bottom of the base portion 311 and parallel to the first inserting portion 312. A bottom edge of the first fixing slice 31 is bent perpendicularly to form a soldering slice 32 for being soldered with a printed circuit board (not shown). In this embodiment, the soldering slice 32 is bent from bottoms of the base portion 311 and the second inserting portion 313. A connecting portion 33 is extended perpendicularly from an upper end of a rear edge of the base portion 311 of the first fixing slice 31 and opposite to the soldering slice 32. A distal end of the connecting portion 33 is bent frontward to form a second fixing slice 34 which is parallel to the base portion 311 of the first fixing slice 31. A side edge of the first inserting portion 312 defines a barb 3121. A side edge of the second fixing slice 34 defines a barb 341.

Referring to FIG. 3, FIG. 4, FIG. 6 and FIG. 8, in assembly, the conductive terminal 20 is mounted in the terminal groove 16 of the insulating housing 10, with the contacting portion 21 extending out of the front surface 13 of the insulating housing 10 for contacting with an outer battery (not shown), the soldering portion 22 exposed from the bottom surface 12 of the insulating housing 10 for being soldered on the printed circuit board. The fixing element 30 is mounted in the insulating housing 10. The first fixing slice 31 is secured in the first fixing groove 142 of the insulating housing 10. The base portion 311 of the first fixing slice 31 is fixed in the main groove 1421 of the insulating housing 10. The first inserting portion 312 of the first fixing slice 31 is secured in the first inserting groove 1422 of the first fixing groove 142, with the barb 3121 abutting against a side of the first inserting groove 1422. The second inserting portion 313 is received in the second inserting groove 1423 of the first fixing groove 142. The connecting portion 33 is attached on the rear surface 14 of the insulating housing 10. The second fixing slice 34 of the fixing element 30 is secured in the second fixing groove 141 of the insulating housing 10, with the barb 341 abutting against a side of the second fixing groove 141 of the insulating housing 10. The soldering slice 32 exposes outside of the bottom surface 12 and further extends beyond the corresponding side surface 15 of the insulating housing 10 for being soldered with the printed circuit board.

As described above, the battery connector 100 further has two fixing elements 30 which respectively have the soldering slice 32 soldered on the printed circuit board. So such structure can effectively avoid the battery connector 100 breaking off from the printed circuit board and further strength the connection between the battery connector 100 and the printed circuit board even when the outer battery excessively abuts against the battery connector 100. As a result, the electrical connection between the battery connector 100 and the printed circuit board is more stable than the case shown as the prior art. Furthermore, as the second fixing slice 34 of the fixing element 30 is secured in the second fixing groove 141 of the insulating housing 10 and the connecting portion 33 attaches on the rear surface 14 of the insulating housing 10, so such structure can improve the strengthen of the battery connector 100.

The foregoing description of the present invention has been presented for the purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. A battery connector mounted on a printed circuit board, comprising:
    an insulating housing having a top surface, a bottom surface, a front surface, a rear surface and two side surfaces, the front surface defining a plurality of terminal grooves extending along a vertical direction, two opposite sides of the rear surface respectively defining a first fixing groove extending vertically adjacent to the corresponding side surface and penetrating the bottom surface of the insulating housing, and a second fixing groove spaced away from the first fixing groove;
    a plurality of conductive terminals fixed in the terminal grooves respectively, each of the conductive terminals having a soldering portion exposed from the bottom surface of the insulating housing for being soldered on the printed circuit board; and
    a pair of fixing elements each having a first fixing slice secured in the first fixing groove, a bottom edge of the first fixing slice being bent perpendicularly to form a soldering slice exposed outside the bottom surface for being soldered with the printed circuit board, a connecting portion being extended perpendicularly from a rear edge of the first fixing slice for being attached on the rear surface of the insulating housing, a distal end of the connecting portion being bent frontward to form a second fixing slice fixed in the second fixing groove.

2. The battery connector as claimed in claim 1, wherein the first fixing groove includes a main groove defined in the rear surface and a first inserting groove recessed toward the front surface from an upper end of the bottom of the main groove, the first fixing slice of the fixing element includes a base portion secured in the main groove of the insulating housing and a first inserting portion extended frontward from an upper end of a front edge of the base portion for being fixed in the first inserting groove.

3. The battery connector as claimed in claim 2, wherein the connecting portion is extended from an upper end of a rear edge of the base portion, the second fixing groove is substantially in alignment with an upper end of the main groove.

4. The battery connector as claimed in claim 2, wherein a side edge of the first inserting portion defines a barb for being against a side of the first inserting groove.

5. The battery connector as claimed in claim 4, wherein a side edge of the second fixing slice defines a barb for being against a side of the second fixing groove.

6. The battery connector as claimed in claim 2, wherein the first fixing groove further includes a second inserting groove recessed toward the front surface from a lower end of the bottom of the main groove, the first fixing slice further includes a second inserting portion extended frontward from a lower end of the front edge of the base portion for being received in the second inserting groove.

7. The battery connector as claimed in claim 6, wherein the soldering slice is bent from bottoms of the base portion and the second inserting portion, the second inserting groove penetrates the bottom surface of the insulating housing.

8. The battery connector as claimed in claim 1, wherein the connecting portion is bent opposite to the soldering slice.

9. The battery connector as claimed in claim 8, wherein the soldering slice extends beyond the corresponding side surface.

\* \* \* \* \*